United States Patent
Mosinskis et al.

(10) Patent No.: US 9,503,040 B1
(45) Date of Patent: Nov. 22, 2016

(54) METHOD AND APPARATUS FOR CHANGING THE GAIN OF A RADIO FREQUENCY SIGNAL

(71) Applicant: Maxlinear Asia Singapore PTE LTD, Singapore (SG)

(72) Inventors: Paulius Mosinskis, Richlandtown, PA (US); Omkar Joshi, Allentown, PA (US)

(73) Assignee: MAXLINEAR ASIA SINGAPORE PTE LTD, Singapore (SG)

( * ) Notice: Subject to any disclaimer, the term of this patent is extended or adjusted under 35 U.S.C. 154(b) by 0 days.

(21) Appl. No.: 13/795,742

(22) Filed: Mar. 12, 2013

(51) Int. Cl.
  *H04B 1/06* (2006.01)
  *H04B 7/00* (2006.01)
  *H04B 1/10* (2006.01)
  *H03G 3/20* (2006.01)

(52) U.S. Cl.
  CPC .................................. *H03G 3/20* (2013.01)

(58) Field of Classification Search
  CPC ................................................... H03G 3/20
  USPC ............ 455/232.1, 234.1, 234.2, 249.1, 296, 455/311; 375/345, 346; 330/278, 284, 149
  See application file for complete search history.

(56) References Cited

U.S. PATENT DOCUMENTS

| | | | | |
|---|---|---|---|---|
| 5,870,670 A * | 2/1999 | Ripley | ................... | H03D 7/165 455/304 |
| 6,591,087 B1 * | 7/2003 | Oda | ................................ | 455/78 |
| 7,085,333 B2 * | 8/2006 | Jeffers et al. | .................. | 375/345 |
| 8,264,295 B2 * | 9/2012 | Trivedi | ..................... | 331/177 V |
| 2003/0143967 A1 * | 7/2003 | Ciccarelli et al. | ......... | 455/232.1 |
| 2003/0227353 A1 * | 12/2003 | Fayyaz | .......................... | 333/161 |
| 2005/0032483 A1 * | 2/2005 | Klomsdorf et al. | .......... | 455/110 |
| 2005/0054314 A1 * | 3/2005 | Dobrovolny | ................ | 455/234.1 |
| 2006/0164164 A1 * | 7/2006 | Rogers et al. | ................. | 330/252 |
| 2006/0176112 A1 * | 8/2006 | Nakatani et al. | ................ | 330/51 |
| 2006/0223463 A1 * | 10/2006 | Rahman et al. | ........... | 455/127.2 |
| 2012/0098698 A1 | 4/2012 | Reuter | | |
| 2012/0112956 A1 | 5/2012 | Trotta et al. | | |
| 2012/0326781 A1 * | 12/2012 | Mori et al. | ..................... | 330/127 |
| 2013/0194139 A1 * | 8/2013 | Nickel et al. | .................. | 343/703 |
| 2014/0070905 A1 * | 3/2014 | Raieszadeh | .............. | H03H 3/00 333/174 |

OTHER PUBLICATIONS

Kim et al., "A 54-862-MHz CMOS Transceiver for TV-Band White-Space Device Applications," IEEE Transactions on Microwave Theory and Techniques, 12 pages, vol. 59, No. 4, Apr. 2011, USA.

Ryu, "Design Issues of CMOS VCO for RF Transeivers," Journal of the Korean Institute of Electromagnetic Engineering and Science, 7 pages, vol. 9, No. 1, Mar. 2009, Korea.

* cited by examiner

*Primary Examiner* — Nguyen Vo
(74) *Attorney, Agent, or Firm* — McAndrews, Held & Malloy Ltd.

(57) ABSTRACT

A method and electronic circuit for changing the gain of a radio frequency signal. The apparatus is an electronic circuit comprising one or more variable gain electronic elements, and one or more adjustable phase shifting elements. The method comprises the steps of receiving a radio frequency signal, varying the gain of the variable gain electronic element while the variable gain electronic element changes the amplitude of the radio frequency signal, and adjusting an adjustable phase shifting element to generate a reverse phase shift in the radio frequency signal in response to the associated phase shift from the step of varying the gain.

20 Claims, 5 Drawing Sheets

METHOD AND APPARATUS FOR CHANGING THE GAIN OF A RADIO FREQUENCY SIGNAL

FIELD

The present disclosure relates generally to radio frequency signal processing. More particularly, the present disclosure relates to a method and apparatus for changing the gain of a radio frequency signal.

BACKGROUND

An analog radio frequency (RF) signal typically needs to be transformed once it has been received by an RF antenna. A common transformation is to change the amplitude of the RF signal. This transformation can be performed in an electronic circuit such as an RF signal chain. An RF signal chain transforms RF signals in preparation for processing by other electronic circuits. Any electronic circuit which performs this function is a RF signal chain. Various electronic elements including, but not limited to, an amplifier and an attenuator can be used in the RF signal chain to perform this transformation. An electronic element is said to have gain, which can be measured in decibels, if it causes a change in amplitude in the RF signal.

If the gain of the electronic element or electronic circuit can be changed during operation (while the RF signal is being transformed), the electronic element or circuit, respectively, is said to have variable gain. A variable gain RF signal chain is more useful than one which has a fixed gain and cannot be varied during operation. This is because RF signals are dynamic and, in certain applications, the RF signal amplitude can vary widely from signal to signal. In these applications, variable gain RF signal chains are useful for maximizing the signal-to-noise and distortion ratio of a RF signal, while preventing the overload of its electronic elements.

A variable gain RF signal chain typically comprises one or more variable gain electronic elements, such as variable amplifiers, variable attenuators, or more complex electronic elements incorporating a variable amplifier or variable attenuator such as a voltage gain amplifier (VGA). A VGA typically comprises two fixed amplifiers and a variable attenuator therebetween.

A known problem with changing the gain in a variable gain RF signal chain (through one of its electronic elements) during operation is that it can cause an unwanted phase shift in the RF signal being transformed. The phase shift is measured relative to the phase of the RF signal at the RF antenna or the input to the electronic circuit. A phase shift, especially an abrupt phase shift, is undesirable. It can cause an increase in bit errors in encoding methods dependent on phase information such as Quadrature Amplitude Modulation. The phase shift is caused by imperfect electronic components with non-zero capacitance. A change in gain causes a change in capacitance in the RF signal chain. A change in capacitance causes a phase shift in the RF signal.

It is known in the art that the phase shift can be reduced by minimizing the capacitance in the electronic components used in the variable gain electronic elements. Although it is not possible to eliminate entirely from the electronic circuit, capacitance can by reduced by minimizing the number of electronic elements contributing capacitance, minimizing the size of electronic elements contributing capacitance, and arranging the electronic elements contributing capacitance in a certain configuration. For example, capacitance in an attenuator (such as a simple resistive divider) can be reduced by limiting the size of the resistors and arranging the resistors in either a binary weighted configuration or cascade configuration.

A drawback to limiting the amount, size, and configuration of resistors, however, is that it also limits the attenuation range and frequencies of the simple resistive divider. Accordingly, an electronic circuit using this solution is limited in the amount of gain change.

It is desirable to provide an approach for varying the gain experienced by an RF signal that overcomes at least one drawback of known approaches.

BRIEF DESCRIPTION OF THE DRAWINGS

Embodiments of the present disclosure will now be described, by way of example only, with reference to the attached Figures.

DETAILED DESCRIPTION

This specification describes a method and apparatus for changing the gain of a radio frequency signal. The apparatus is an electronic circuit comprising one or more variable gain electronic elements, and one or more adjustable phase shifting elements. A knowledgeable person skilled in the art will appreciate that a radio frequency signal chain can be any electronic circuit through which a radio frequency signal is transformed. The method comprises the steps of receiving a radio frequency signal, changing the amplitude of the radio frequency signal with a variable gain electronic element, varying the gain of the electronic element while the radio frequency signal is being transformed, and shifting the phase of the radio frequency signal with an adjustable phase shifting element.

Embodiments of the present disclosure take advantage of the fact that it is the phase shift in the RF signal relative to an initial phase, not the absolute phase of the RF signal (as would be observed at an antenna receiving the RF signal), which causes an increase in bit errors in encoding methods. When the gain in the electronic circuit is changed during operation by changing one of its variable electronic elements, the adjustable phase shifting element is also adjusted to cause a corresponding reverse phase shift in the RF signal. The amount of reverse phase shift need not be equivalent to the phase shift caused by changing the gain in the variable gain electronic element. In an embodiment, the amount of reverse phase shift simply needs to be sufficient to prevent bit errors in encoding methods using the RF signal. The reverse phase shift limits the overall phase shift in the RF signal relative to the RF signal's initial phase. Accordingly, variable gain electronic elements, and the electronic components of which they comprise, need no longer be limited in amount, size, or configuration as would be required in the prior art.

In an embodiment, the present disclosure provides an electronic circuit comprising an input for receiving a radio frequency (RF) signal; a variable gain electronic element in electrical communication with the input; an adjustable phase shifting element in electrical communication with the input and with the variable gain electronic element; and a controller in electrical communication with the variable gain electronic element and with the adjustable phase shifting element, the controller being configured to change a gain of the variable gain electronic element, the gain change causing a phase shift in the RF signal, the controller being further configured to adjust the adjustable phase shifting element to generate the reverse phase shift in the RF signal to offset the phase shift caused by the gain change of the variable gain electronic element. In an example embodiment, the reverse phase shift corresponds in magnitude to the phase shift. In another example embodiment, the reverse phase shift is sufficient to prevent bit errors when encoding the RF signal. In another example embodiment, the adjustable phase shifting element comprises a plurality of adjustable phase shifting elements arranged in a linearly weighted configuration. In another example embodiment, the adjustable phase shifting element comprises a plurality of adjustable phase shifting elements arranged in a binary weighted configuration. In another example embodiment, the adjustable phase shifting element comprises a plurality of adjustable phase shifting elements arranged in a cascade configuration. In another example embodiment, the variable gain electronic element comprises a voltage gain amplifier. In another example embodiment, the variable gain electronic element comprises a variable attenuator. In another example embodiment, the variable attenuator comprises an adjustable resistive divider. In another example embodiment, the plurality of adjustable phase shifting elements comprise switched capacitors. In another example embodiment, the plurality of adjustable phase shifting elements comprise switched inductors. In another example embodiment, the adjustable phase shifting element comprises one or more varactors. In another example embodiment, the varactors are switchable.

In an embodiment, the present disclosure provides a method comprising receiving a RF signal at an input; changing, using a controller, a gain of a variable gain electronic element which causes a phase shift in the RF signal; and adjusting, using the controller, an adjustable phase shifting element to generate a reverse phase shift in the RF signal to offset the phase shift from changing the gain of the variable gain electronic element. In an example embodiment, the generated reverse phase shift corresponds in magnitude to the phase shift from the change in the gain of the variable gain electronic element. In another example embodiment, the generated reverse phase shift is sufficient to prevent bit errors when encoding the radio frequency signal. In another example embodiment, changing the gain comprises decreasing the gain, and adjusting the phase shift comprises increasing the phase shift. In another example embodiment, changing the gain comprises increasing the gain, and adjusting the phase shift comprises decreasing the phase shift.

Other aspects and features of the present disclosure will become apparent to those ordinarily skilled in the art upon review of the following description of specific embodiments in conjunction with the accompanying figures.

Figure 1:
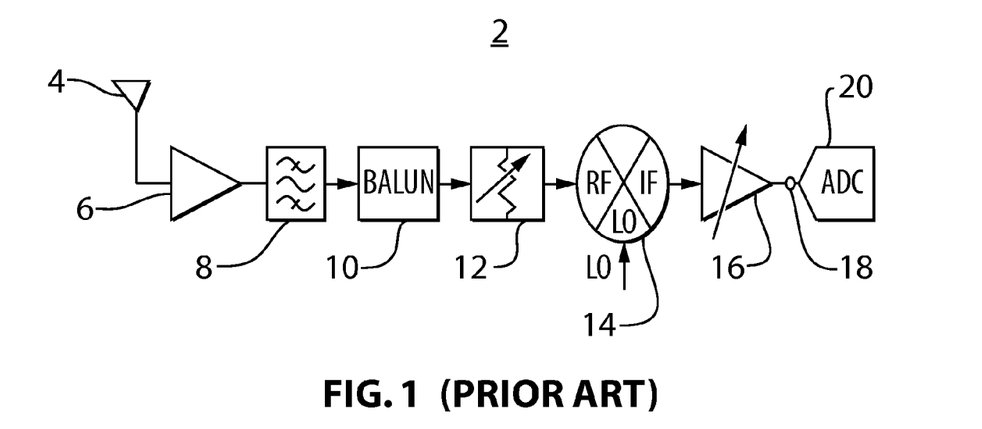
FIG. 1 illustrates a known RF signal chain.

FIG. 1 illustrates a known RF signal chain. RF signal chains typically transform RF signals in preparation for processing by other electronic circuits.

As shown in FIG. 1, the RF signal chain 2 has a RF antenna 4 electrically connected in series with an amplifier 6, a filter 8, a balun 10, a variable attenuator 12, a mixer 14, and a variable gain amplifier (VGA) 16. An RF signal chain can include combinations of some or all of the above electronic elements to achieve a particular transformation of the RF signal. A RF signal is received by the RF antenna 4. The RF signal is amplified and filtered by the amplifier 6 and the filter 8, respectively. The amplitude of the RF signal is then attenuated by the attenuator 12, and mixed by the mixer 14 and output into the VGA 16. The gain of the VGA 16 is selected and the RF signal is amplified accordingly. The RF signal is communicated to an output 18 for further processing by other electronic circuits listening to the output 18. These other electronic circuits could include, for example, an analog to digital converter 22 or an encoding module for encoding methods such as Quadrature Amplitude Modulation.

The amplifier 6 and attenuator 12 can either be fixed so as to only provide a preset gain, or can be variable so that their gain can be changed during operation.

Figure 2:
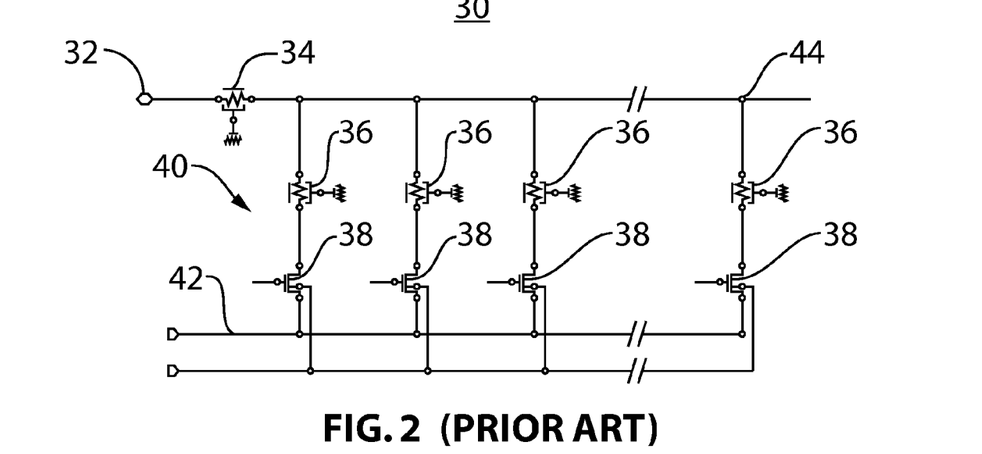
FIG. 2 illustrates a known adjustable resistive divider.

FIG. 2 illustrates an example of a variable attenuator known in the art as an adjustable resistive divider. In FIG. 2, an adjustable resistive divider 30 comprises an input 32, a first resistor 34 placed in series with one or more switched resistors 40 each comprising a second resistor 36 and a field effect transistor 38. In another embodiment, a bipolar junction transistor is used instead of a field effect transistor. The switched resistors 40 are arranged in parallel with one another and all connected to a reference ground 42. An output 44 is located between the first resistor 34 and the switched resistors 40. The output 44 communicates the attenuated RF signal to the remaining RF signal chain. When none of the switched resistors 40 are enabled, the first resistor 34 attenuates the RF signal a fixed amount, the value of which is determined by the input impedance of the next stage. When one or more of the switched resistors 40 are enabled, the attenuation decreases by an amount equal to the ratio between the first resistor 34 and the combination of enabled second resistors 36. In other words, when one or more switched resistors 40 are enabled, the loss of the adjustable resistive divider 30 increases and the RF signal is attenuated by a decreasing amount corresponding to the decrease in gain.

Figure 3:
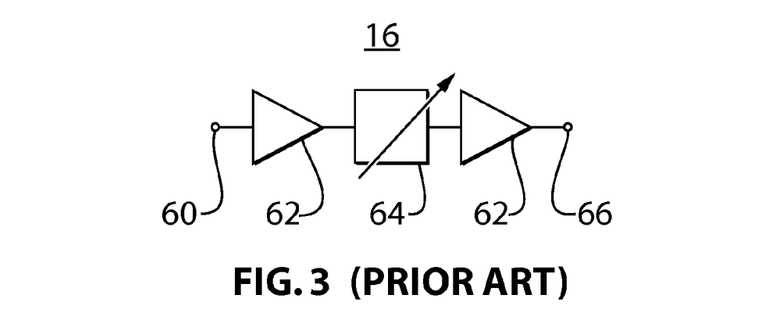
FIG. 3 illustrates a known variable gain amplifier consisting of a variable attenuator between two fixed amplifiers.

Variable attenuators, such as the adjustable resistive divider 30, can be combined with other electronic elements to create a more complex electronic element with variable gain. FIG. 3 illustrates a known variable gain amplifier 16. As shown in FIG. 3, a variable attenuator 64 is combined with, and placed between, two fixed amplifiers 62. The gain of the VGA 16 can be varied during operation by changing the variable attenuator 64. The VGA 16 has an input 60 for receiving the RF signal and an output 66 for outputting the attenuated or amplified RF signal.

Using an adjustable resistive divider, either alone or as part of other electronic elements such as a VGA 16, however, creates a known problem. Enabling or disabling one or more of the switched resistors 40 causes a change in capacitance in the adjustable resistive divider 30 and, accordingly, the RF signal chain. This is because resistors (and the switches used to control resistors) are imperfect and have non-zero capacitance. A change in capacitance in the RF signal chain causes an unwanted phase shift in the RF signal being transformed. A phase shift, especially an abrupt phase shift, is undesirable. It can cause an increase in bit errors in encoding methods dependant on phase information such as Quadrature Amplitude Modulation.

Known approaches to solving this problem include limiting the size and number of second resistors 36, and arranging the second resistors 36 in certain configurations. A problem with this solution is that it limits the attenuation range of, and the RF frequencies that can be transformed by, the RF signal chain, generally, and the variable attenuator 12, specifically.

Rather than removing electronic elements and limiting their size, embodiments of the present disclosure add one or more adjustable phase shifting elements, such as switched capacitors, switched inductors, varactors, and any combination and any configuration thereof, to the RF signal chain to address the phase shift problem.

Figure 4:
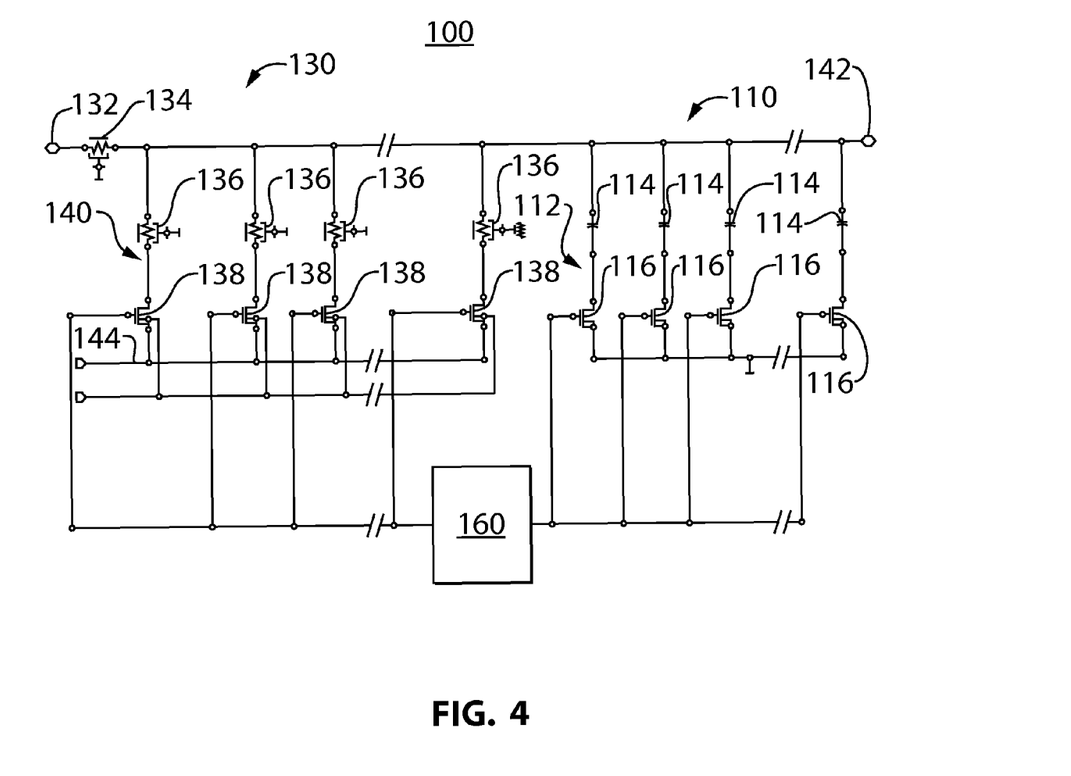
FIG. 4 illustrates a modified adjustable resistive divider according to an embodiment of the present disclosure.

FIG. 4 illustrates a modified adjustable resistive divider 100 according to an embodiment of the present disclosure. The modified adjustable resistive divider 100 comprises an adjustable resistive divider 130 and an adjustable phase shifting element 110 electrically connected in series with one another. The adjustable resistive divider 130 is substantially the same as the adjustable resistive divider 30 in FIG. 2. In the example embodiment of FIG. 4, the adjustable phase shifting element 110 comprises a bank of parallel switched capacitors 112. A switched capacitor 112 comprises a capacitor 114 in series with a field effect transistor 116. In another embodiment, a bipolar junction transistor is used instead of a field effect transistor. The bank of switched capacitors 112 is placed in series between the adjustable resistive divider 130 and the output 142.

In an embodiment, the number, size, and arrangement of switched capacitors 112 is selected according to the maximum possible phase shift the RF signal can experience from a gain change in the adjustable resistive divider 130. As previously noted, only phase change is important, not the absolute phase. In FIG. 4, the capacitors are selected, configured, and switched as follows. When the switched resistors 140 are configured, the maximum absolute phase shift, which would be caused by enabling all switched resistors 140, is determined. Sufficient switched capacitors 112 are selected so as to achieve this phase shift when all of the switched resistors 140 are disabled. When all switched resistors 140 are disabled, all switched capacitors 112 are enabled. As switched resistors 140 are enabled and the RF signal phase changes, switched capacitors 112 are disabled such that the relative phase shift is minimized. Similarly, when switched resistors 140 are enabled, switched capacitors 112 are disabled. This results in absolute capacitance, and therefore phase shift, either being kept constant or experiencing a gradual (rather than abrupt) change for all resistors setting.

The switched capacitors 112 can be arranged in any number of weighting configurations known in the art including, but not limited to, linearly weighted and binary weighted configurations.

The method for enabling and disabling switched capacitors 112 or switched resistors 140 is known to a knowledgeable person skilled in the art. In an embodiment, the switched capacitors 112 or switched resistors 140 are connected to, and controlled by, a controller 160 comprising memory and logic. The controller 160 can either be analog, or digital and include a microcontroller. In an embodiment, experimentation is used to determine when the switched capacitors 112 and the switched resistor 114 should be enabled or disabled to achieve the results described herein. Experimentation yields a set of values which is pre-programmed into the memory of the controller 160. During operation, the controller 160 enables and disables the switched capacitors 112 and the switched resistor 114 according to the pre-programmed values.

A knowledgeable person skilled in the art would appreciate that any adjustable phase shifting element 110 can be added and used in the electronic circuit instead of, or in addition to, a parallel bank of switched capacitors 112 as shown in FIG. 4. In another embodiment, the adjustable phase shifting element 110 comprises one or more inductors. In this embodiment, as the electronic circuit's capacitance is increased, the inductance is also increased. In another embodiment, the adjustable phase shifting element 110 comprises one or more varactors. In this embodiment, the varactors' capacitance may be controlled by a variable voltage signal alone, or in conjunction with switching the varactors using a field effect transistor or bipolar junction transistor. In another embodiment, the adjustable phase shifting element 110 comprises a combination of one or more inductors, capacitors, or varactors.

Optionally, adjustable phase shifting elements 110 can be added to and used in the RF signal chain. This would allow overall control of RF signal phase shift at the RF signal chain output 20 (FIG. 1).

Figure 5:
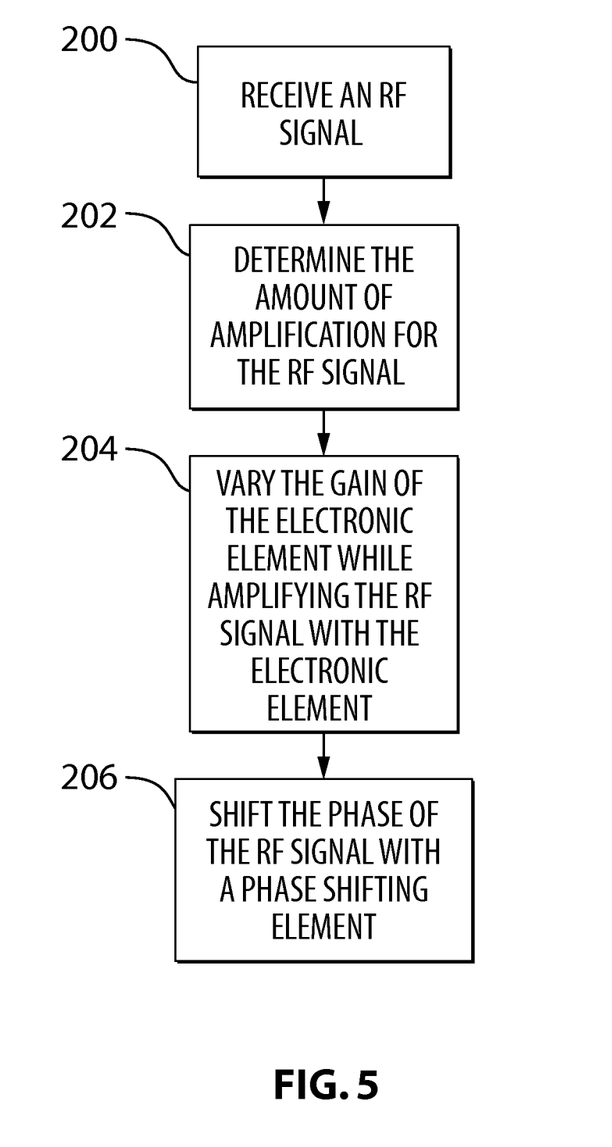
FIG. 5 illustrates a flowchart according to an embodiment of the present disclosure.

FIG. 5 shows a flowchart illustrating a method of varying the gain in the RF signal and shifting the phase of the RF signal in accordance with an embodiment of the present disclosure.

As shown in FIG. 5, a RF signal is received in step 200 at the input to an electronic circuit, such as a RF antenna in a RF signal chain. The RF signal chain determines what amount of amplification to the signal is required in step 202. A controller, such as the controller 160 in FIG. 4, varies the gain of the one or more variable gain electronic elements in step 204 while the electronic element amplifies the RF signal. When the gain of the variable gain electronic elements is changed, this causes or generates an unwanted phase change in the RF signal. A corresponding, but inverse, phase shift in the RF signal is generated by the controller in step 206 by adjusting the adjustable phase shifting elements.

In the present disclosure fewer limitations, as compared to the prior art, on the number, size, and configuration of electronic elements used for controlling the gain in the RF signal chain 2 may be required. In some implementations there is, however, an implementation penalty for adding the adjustable phase shifting elements 110. The field effect transistors 116, 138, used to control the adjustable phase shifting elements 110 and adjustable resistive divider 130, have inherent parasitic capacitance. This parasitic capacitance can cause a dynamic (and unwanted) phase shift in the RF signal, which cannot be reversed by further adjusting the adjustable phase shifting elements 110.

Figure 6:
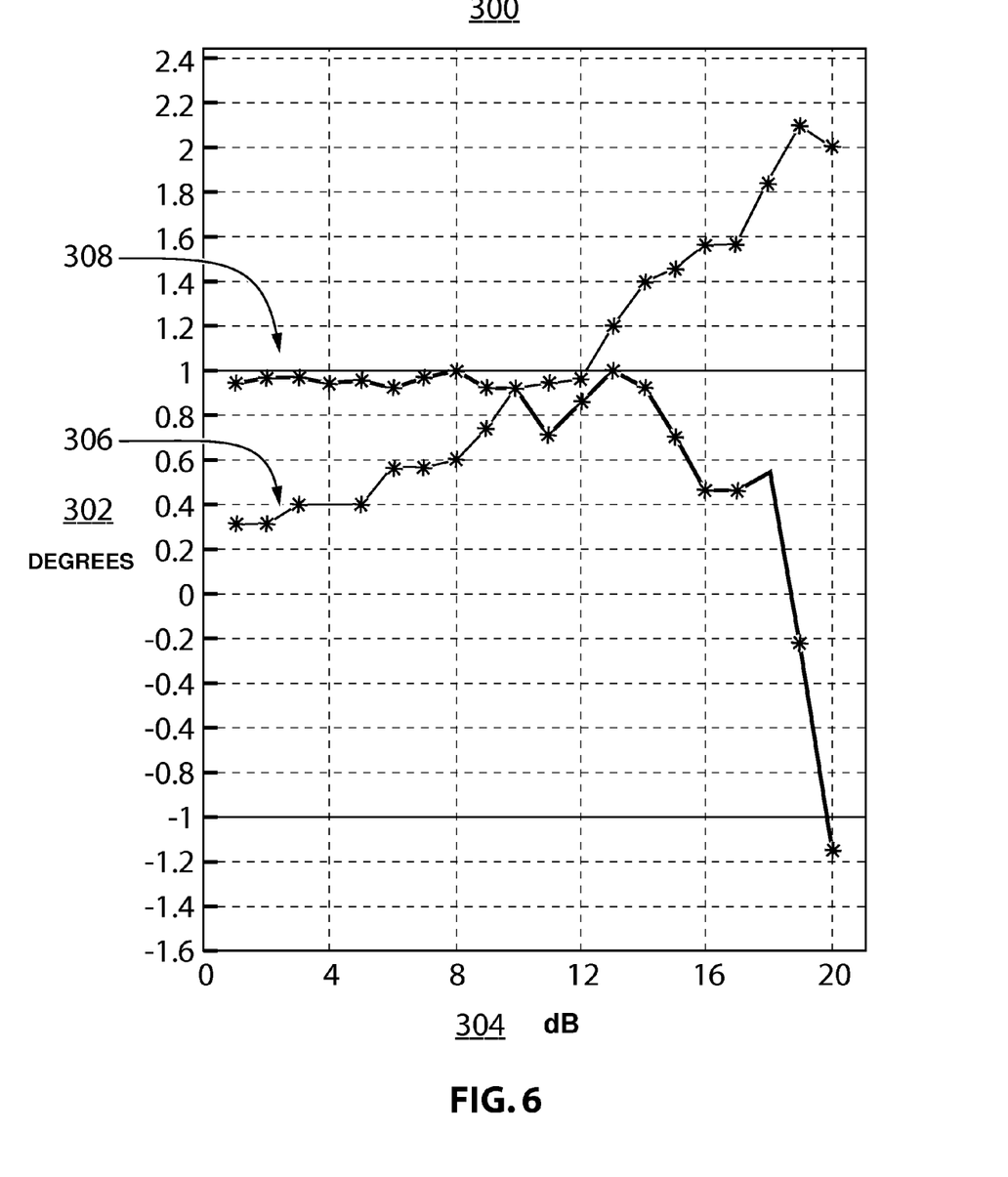
FIG. 6 is a graph showing the results of an RF signal chain with phase compensation and no phase compensation for a RF at 280 megahertz.

FIG. 6 shows a first graph 300 plotting phase shift 302 (in degrees) against gain change 304 (in decibels). The first graph 300 shows the results of transforming a 280 megahertz RF signal with the RF signal chain of FIG. 1, with and without the embodiment of the present disclosure as shown in FIG. 4. The phase shift 302 is measured relative to the phase of the RF signal as received at the input of the VGA 16 (FIG. 1). A first plot 306 shows the results for a RF signal chain with no adjustable phase shifting elements. A second plot 308 shows the results for a RF signal chain with adjustable phase shifting elements 110 (FIG. 4) as embodied in the present disclosure.

Graph 300 illustrates that for small gain changes (0 to 10 decibels), the parasitic capacitance from the adjustable phase shifting elements 110 causes an unwanted phase shift greater than the unwanted phase shift from an electronic circuit with no adjustable phase shifting elements. At just above 0 decibels of gain, the phase shift is 0.7 degrees worse. For large changes in gain, however, the opposite is true: the unwanted phase shift caused by the parasitic capacitance from adjustable phase shifting elements is less than the unwanted phase shift caused by an electronic circuit without adjustable phase shifting elements. At 20 decibels, the phase shift is 1 degree better.

Figure 7:
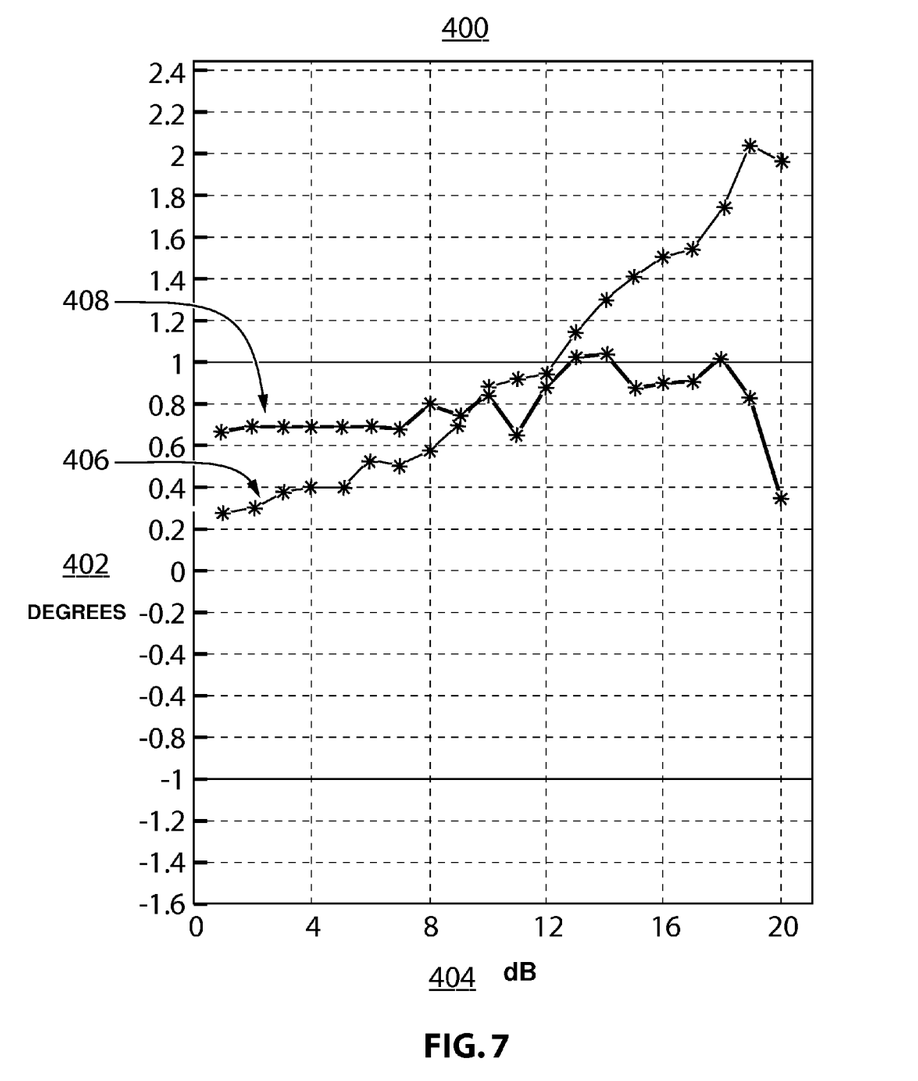
FIG. 7 is a graph substantially similar to FIG. 6 except for a RF at 140 megahertz.

FIG. 7 shows a second graph 400 substantially the same as the graph 300 of FIG. 6, except that the RF signal being transformed is 140 megahertz. Again, the results are based on using the RF signal chain of FIG. 1, with and without the embodiment of the present disclosure as shown in FIG. 4. The graph 400 plots phase shift 402 (in degrees) against gain change 404 (in decibels). A first plot 406 shows the results for a RF signal chain with no adjustable phase shifting elements. A second plot 408 shows the results for a RF signal chain with adjustable phase shifting elements 110 (FIG. 4) as embodied in the present disclosure. The second graph 400 illustrates that the effect of the parasitic capacitance, caused by adjustable phase shifting elements, is not as significant at lower RF signal frequencies. At just above 0 decibels the phase shift in the electronic circuit with adjustable phase shifting elements is only 0.4 degrees worse than one without; at 20 decibels it is almost 1.8 degrees better.

In the preceding description, for purposes of explanation, numerous details are set forth in order to provide a thorough understanding of the embodiments. However, it will be apparent to one skilled in the art that these specific details are not required. In other instances, well-known electronic structures and circuits are shown in block diagram form in order to not obscure the understanding. For example, specific details are not provided as to whether the embodiments described herein are implemented as a software routine, hardware circuit, firmware, or a combination thereof.

The above-described embodiments are intended to be examples only. Alterations, modifications and variations can be effected to the particular embodiments by those of skill in the art without departing from the scope, which is defined solely by the claims appended hereto.

What is claimed is:

1. An electronic circuit comprising:
an input for receiving a radio frequency (RF) signal;
a variable gain electronic element in electrical communication with the input, the variable gain electronic element comprising a variable resistor;
an adjustable analog phase shifting element in electrical communication with the input and with the variable gain electronic element, the adjustable analog phase shifting element comprising a varactor selected to offset a maximum possible phase shift that the RF signal can experience from the variable gain electronic element; and
a controller in electrical communication with the variable gain electronic element and with the adjustable analog phase shifting element, the controller configured to:
set a capacitance of the adjustable analog phase shifting element by adjusting the varactor to a maximum capacitance,
adjust the variable resistor to change a gain contributed by the variable gain electronic element to the RF signal, the gain change causing an unwanted phase shift in the RF signal, and
reduce the capacitance of the varactor independently of changing the gain of the variable gain electronic element to generate a reverse phase shift in the RF signal to offset the unwanted phase shift caused by the gain change of the variable gain electronic element.

2. The electronic circuit of claim 1 wherein the reverse phase shift corresponds in magnitude to the unwanted phase shift.

3. The electronic circuit of claim 1 wherein the reverse phase shift is sufficient to prevent bit errors when encoding the RF signal.

4. The electronic circuit of claim 1, wherein the varactor comprises a plurality of parallel switched capacitors or inductors arranged in a linearly weighted configuration.

5. The electronic circuit of claim 1, wherein the varactor comprises a plurality of parallel switched capacitors or inductors arranged in a binary weighted configuration.

6. The electronic circuit of claim 1, wherein the varactor comprises a plurality of switched capacitors or inductors arranged in a cascade configuration.

7. The electronic circuit of claim 1, wherein the variable gain electronic element comprises a voltage gain amplifier.

8. The electronic circuit of claim 1, wherein the variable resistor comprises a plurality of switched resistors.

9. The electronic circuit of claim 1, wherein the variable resistor comprises an adjustable resistive divider.

10. The electronic circuit of claim 1, wherein the adjustable analog phase shifting element comprises a plurality of varactors.

11. The electronic circuit of claim 10, wherein the plurality of varactors are switchable.

12. The electronic circuit of claim 1, wherein the variable gain electronic element comprises an adjustable resistive divider comprising the plurality of switched resistors; and the adjustable analog phase shifting element comprises a bank of parallel switched capacitors.

13. The electronic circuit of claim 12, wherein the controller is configured to enable a first portion of the plurality of switched resistors in association with disabling a second portion of the switched capacitors.

14. The electronic circuit of claim 12, wherein the controller is configured to disable a first portion of the plurality of switched resistors in association with enabling a second portion of the switched capacitors.

15. A method comprising:
receiving a radio frequency (RF) signal at an input;
adjusting, using a controller, a plurality of switched resistors, a transistor, or a variable resistor to change a gain contributed to the RF signal which causes an unwanted phase shift in the RF signal;
selecting a size of a varactor to offset a maximum possible phase shift that the RF signal can experience from the variable gain electronic element;
setting a capacitance of the varactor to a maximum capacitance, and
adjusting, using the controller, the varactor, independently of changing the gain, to generate a reverse phase shift in the RF signal to offset the unwanted phase shift from changing the gain.

16. The method of claim 15 wherein the generated reverse phase shift corresponds in magnitude to the unwanted phase shift from the change in the gain.

17. The method of claim 15 wherein, the generated reverse phase shift is sufficient to prevent bit errors when encoding the radio frequency signal.

18. The method of claim 15, wherein one or more of the switched resistors are enabled, and the capacitor is disabled.

19. The method of claim 15, wherein one or more of the switched resistors are disabled, and the capacitor is enabled.

20. An electronic circuit comprising:
an input for receiving a radio frequency (RF) signal;
a variable gain electronic element in electrical communication with the input, the variable gain electronic element comprising an adjustable resistive divider comprising a plurality of switched resistors;
an adjustable analog phase shifting element in electrical communication with the input and with the variable gain electronic element, the adjustable analog phase shifting element comprising a number, size, and arrangement of a plurality of parallel switched capacitors selected to offset a maximum possible phase shift that the RF signal can experience from the variable gain electronic element; and
a controller in electrical communication with the variable gain electronic element and with the adjustable analog phase shifting element, the controller configured to:
set a capacitance of the adjustable analog phase shifting element by enabling all of the switched capacitors,
adjust the plurality of switched resistors to change a gain contributed by the variable gain electronic element to the RF signal, the gain change causing an unwanted phase shift in the RF signal, and
adjust the capacitance of the adjustable analog phase shifting element independently of changing the gain of the variable gain electronic element by selectively disabling one or more of the plurality of switched capacitors to generate a reverse phase shift in the RF signal to offset the unwanted phase shift caused by the gain change of the variable gain electronic element.

* * * * *